United States Patent [19]

Martin

[11] Patent Number: 5,761,241

[45] Date of Patent: Jun. 2, 1998

[54] PROCESS AND DEVICE FOR MEASURING THE JITTER OF A DIGITAL SIGNAL

[76] Inventor: Bruno Jean-Marie Martin, 1, Rue qui Chante, 77600 Chanteloup en brie, France

[21] Appl. No.: 390,748

[22] Filed: Feb. 17, 1995

[30] Foreign Application Priority Data

Feb. 21, 1994 [FR] France .................. 94 01931

[51] Int. Cl.$^6$ ................................ H04B 3/46
[52] U.S. Cl. .................. 375/226; 375/371; 324/600
[58] Field of Search ................ 375/226, 371, 375/375; 327/15, 35, 37; 324/600

[56] References Cited

U.S. PATENT DOCUMENTS

| 3,737,766 | 6/1973 | Lubarsky | 324/57 R |
|---|---|---|---|
| 4,162,453 | 7/1979 | Rudolph | 327/35 |
| 4,327,258 | 4/1982 | Zumbahlen, Jr. et al. | 375/226 |
| 4,740,736 | 4/1988 | Sidman et al. | 318/608 |
| 4,757,452 | 7/1988 | Scott et al. | 375/226 |
| 4,974,234 | 11/1990 | Brandt | 375/226 |

FOREIGN PATENT DOCUMENTS 629866  9/1949  United Kingdom.

OTHER PUBLICATIONS

Jhon D. Ryder, Electrical and Electronic Engineering Series, 1957.

Electronics International, vol. 55 (1982) No. 15, Versatile Circuit Measures Pulse Width Accurately.

*Primary Examiner*—Wellington Chin
*Assistant Examiner*—Conguan Tran
*Attorney, Agent, or Firm*—Patnaude, Videbeck & Marsh

[57] ABSTRACT

The jitter of a serial digital signal is measured by determining a recurrent time window and generating a measurement ramp for each window for which the amplitude of the ramp grows proportional to the positive transition of the digital signal. The amplitude of the ramps at the end of each recurrence of the time windows is converted to digital valves and the digital values are used to calculate jitter.

14 Claims, 5 Drawing Sheets

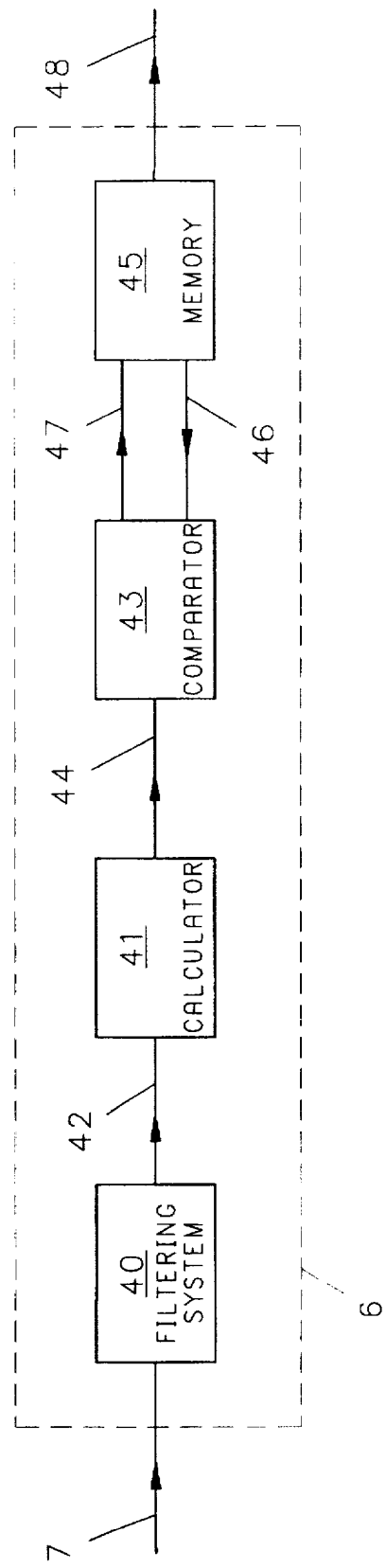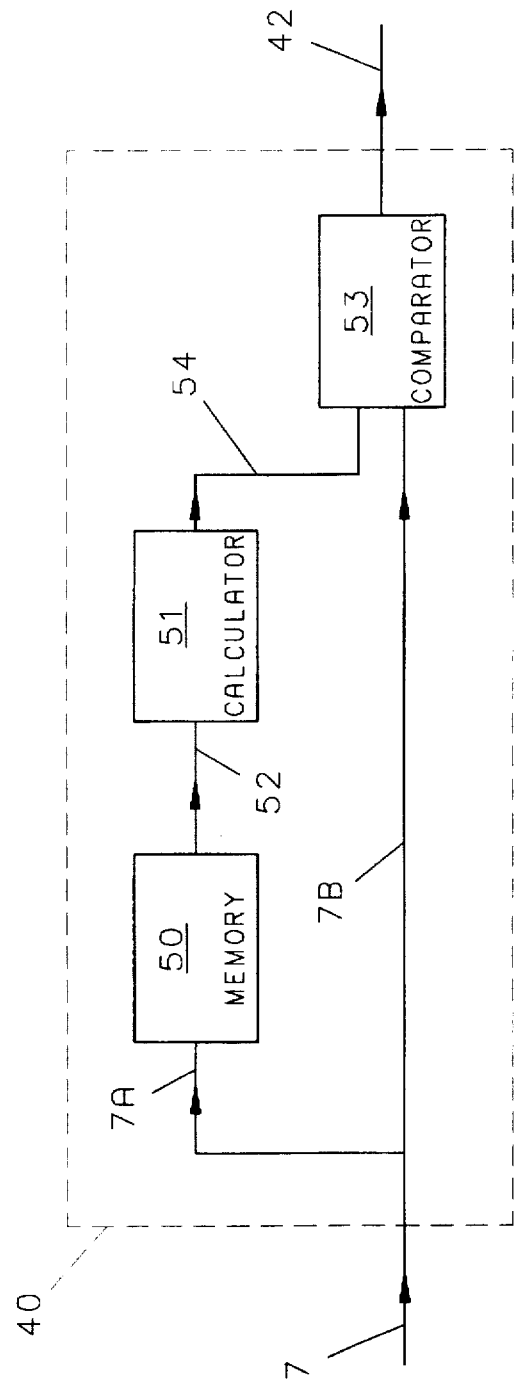

PROCESS AND DEVICE FOR MEASURING THE JITTER OF A DIGITAL SIGNAL

The present invention relates to a process and a device for measuring the jitter of a digital signal, and in particular, to the measurement of the jitter of a serial digital video signal.

BACKGROUND OF THE INVENTION

It is known that the introduction of digital technology into the television sector has raised novel problems, in particular as regards the measurement of the signal used. Indeed, it has proven necessary to find measurement instruments capable of measuring all the important new characteristics. Among these important characteristics of the signal, the jitter parameter, which represents a noise signal corresponding to a phase modulation of the clock signal, is one of the most difficult to measure, especially by virtue of the frequency region used.

Usually, jitter is measured with an oscilloscope, but this method has a number of drawbacks. First, the cost of such an oscilloscope is extremely high, especially with respect to the use envisaged. Furthermore, an oscilloscope does not enable the jitter of a signal to be measured during a video line, as is necessary in particular in the digital television sector.

The object of the present invention is to remedy these drawbacks. It relates to a process making it possible to measure, accurately and directly, without the use of an oscilloscope, and particularly the jitter of a digital signal used in the digital television sector and generally lying within a range included between 140 and 300 Mbits.

SUMMARY OF THE INVENTION

According to the invention, the process for determining the jitter of a digital signal requires the steps of:

determine a recurrent time window;

with each recurrence of the time window, a measurement ramp is generated, the amplitude of which grows proportionally with the duration between the start of the recurrence and the positive transition of the digital signal within the recurrence;

the amplitude of the measurement ramps obtained at the end of the recurrences of the time window is converted into digital values; and the digital values thus obtained are then used to determine the jitter of said signal.

Thus, the difficulty of directly measuring the jitter is solved, according to the invention, by transforming the durations required for the determination of the jitter into measurement ramps whose amplitudes may be easily measured and converted into digital values. It is then sufficient to utilize these digital values to obtain the sought-after jitter.

According to the invention, to determine the jitter of the signal from digital values:

the first digital value obtained is defined as a reference value;

for each succeeding digital value:
said digital value is compared with the current reference value; and
if the digital value is less than the current reference value, the digital value is defined as the new reference value; otherwise, the current reference value is subtracted from the reference digital value;

the differences thus calculated are inter-compared; and the largest difference, in terms of absolute value, is defined as the peak-to-peak value of the jitter of the signal.

Thus, the jitter can be determined at the end of a video line, as is required by the monitoring of a video signal used in the sector of digital-technology television, simply by taking into account the maximum difference obtained during such a video line.

The present invention also relates to a device for the implementation of the process described above.

According to the invention, said device includes:

a sequencer determining a recurrent time window and various clocks intended to control the operation of said device in response to the digital signal to be analyzed;

a time amplitude converter connected to the sequencer, receiving the digital signal to be analyzed and generating measurement ramps as a function of the position of the positive transitions of the digital signal with respect to the recurrent time window;

an analog digital converter connect to the time amplitude converter for converting the amplitudes of said measurement ramps into digital values; and a digital processing system connected to the analog digital converter for determining the jitter of the signal from said digital values.

Preferably, the time amplitude converter is an integrator furnished with at least one capacitor which is to be charged.

The device according to the invention also includes a servocontrol device associated with a time amplitude converter so that the amplitude of the measurement ramps will be modified as a function of the digital values determined by the analog digital converter, thus making it possible to adapt the ramps to the input of the analog digital converter and also to eliminate the ramps with extreme amplitudes, the sources of disturbances.

For this purpose, the servocontrol device is capable of modifying the charging current of the capacitor of the time amplitude converter.

The servocontrol device is controlled by servocontrol signals defined as a function of the amplitude of a calibration ramp with respect to two determined amplitude values so as to center the ramps with respect to the input of the analog digital converter, and/or by servocontrol signals defined as a function of the amplitude of the measurement ramps with respect to at least one determined amplitude value.

Furthermore, the digital processing system includes:

a calculator receiving the digital values to be analyzed, defining a reference value and calculating the difference between the digital values and said reference value;

a comparator inter-comparing the differences thus calculated; and a memory recording the largest difference by absolute value, determined during a series of measurements, for example during a video line in the case of a television, and forwarding this result.

In order to process only the digital values of interest for the determination of the jitter, the digital processing system also includes a filtering system arranged upstream of the calculator in the direction of transmission of the information, and including:

a memory recording the smallest digital value obtained over a series of previous measurements;

a calculating means effecting the sum of this smallest digital value and of a determined value; and a comparison means comparing all the digital values determined by the analog digital converter with the sum and forwarding to the calculator for their analysis only the values which are less than the sum.

BRIEF DESCRIPTION OF THE DRAWINGS

The figures of the appended drawing will elucidate the manner in which the invention may be embodied. In these figures, identical references denote similar elements.

3

Figure 1:
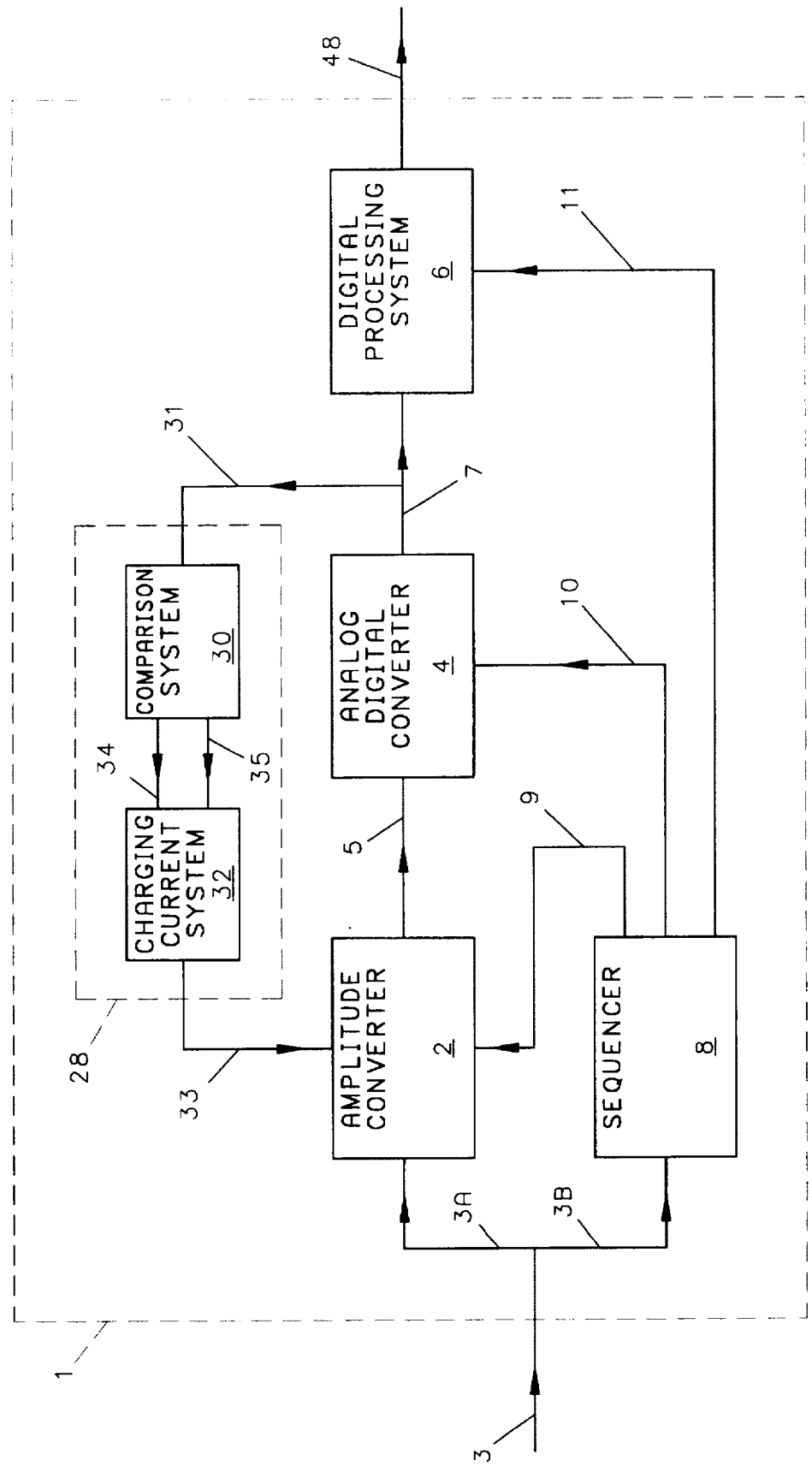
Figure 2:
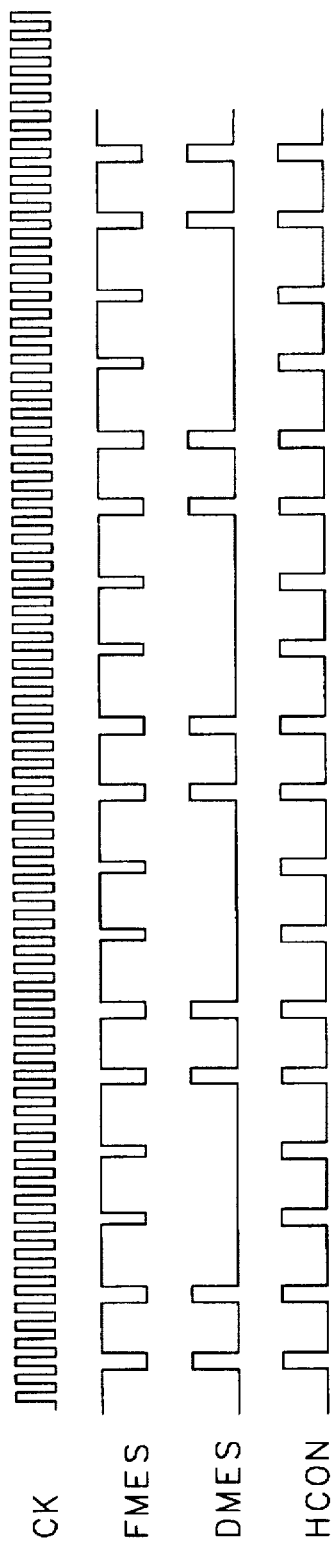
Figure 4:
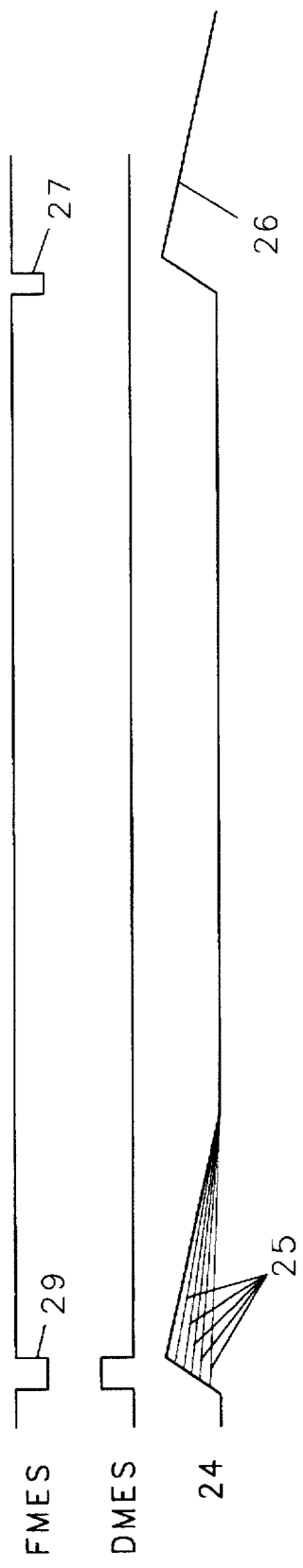
Figure 3:
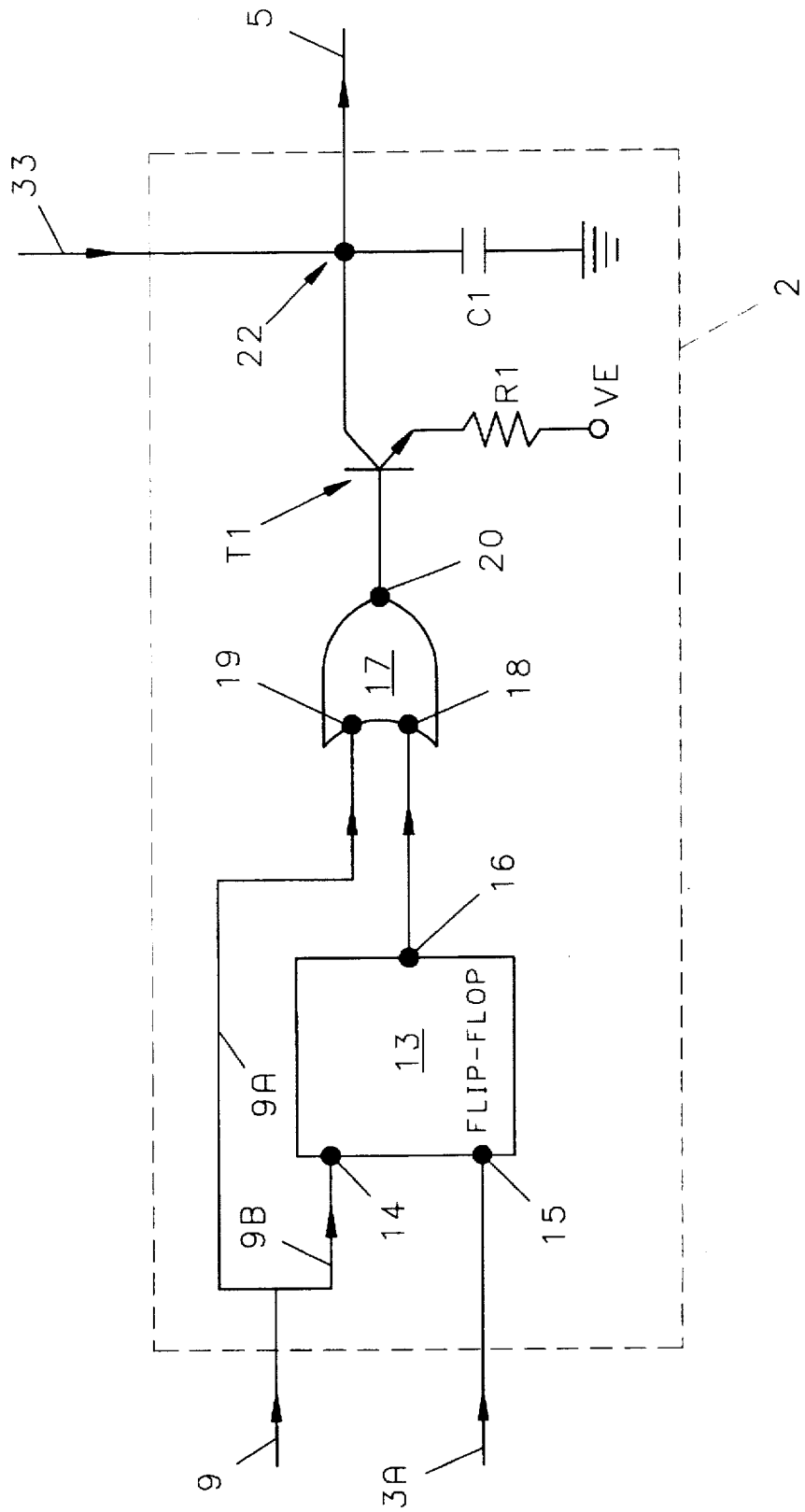
Figure 6:
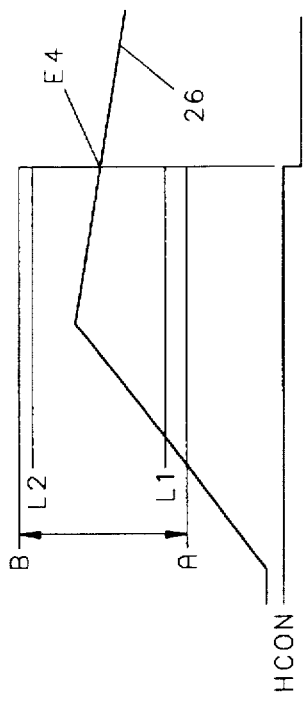
Figure 5:
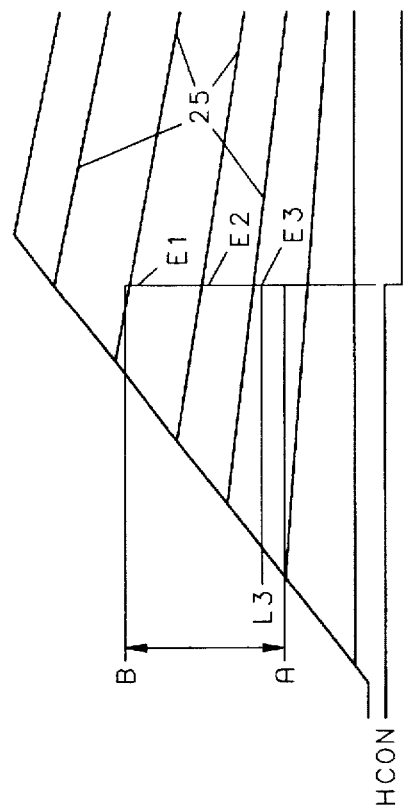
Figure 7:
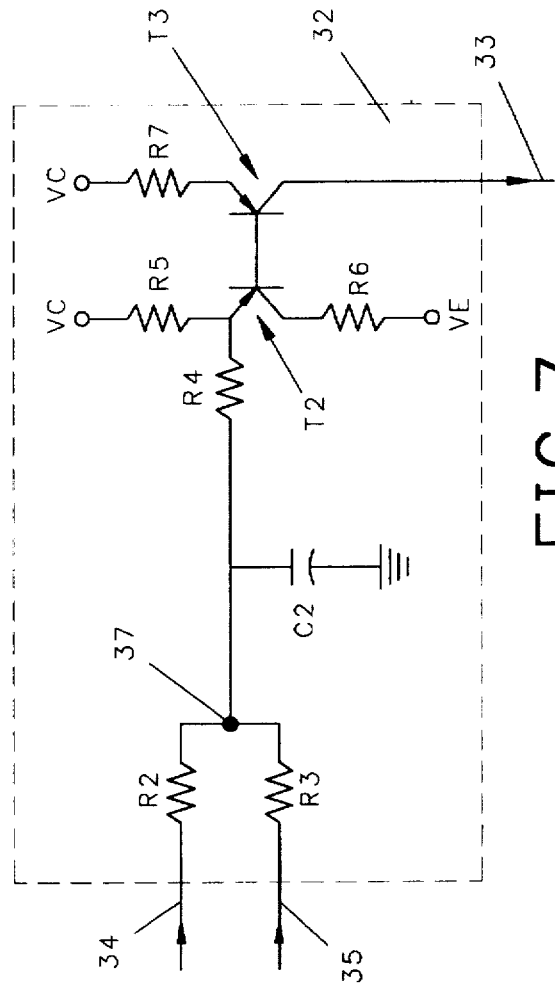

FIG. 1 is the schematic layout of a device according to the invention;

FIG. 2 illustrates various clock signals used for the determination of the jitter;

FIG. 3 shows schematically a time amplitude converter forming part of the device according to the invention;

FIG. 4 illustrates clock signals as well as measurement calibration ramps temporarily associated with these signals;

FIG. 5 shows an enlargement of the measurement ramps of FIG. 4;

FIG. 6 shows an enlargement of the calibration ramp of FIG. 4;

FIG. 7 illustrates schematically a servocontrol device forming part of the device according to the invention;

FIG. 8 is the schematic layout of a digital processing system according to the invention;

FIG. 9 is the schematic layout of a filtering system forming part of the digital processing system of FIG. 8.

DETAILED DESCRIPTION OF A PREFERRED EMBODIMENT

The device 1 according to the invention and represented in FIG. 1 is intended to measure the jitter of a digital signal, in particular a serial digital video signal such as used in the digital television sector. For this purpose, the device 1 includes:

- a time amplitude converter 2, receiving the digital signal to be analyzed, by way of a link 3A which corresponds to one of two branches 3A and 3B of a divided link 3 transmitting the digital signal;
- an analog digital converter 4 connected by way of a link 5 to the time amplitude converter 2;
- a digital processing system 6 connected by way of a link 7 to the analog digital converter 4; and
- a sequencer 8 receiving the digital signal to be analyzed by way of the link 3B and connected to the time amplitude converter 2,
- to the analog digital converter 4 and to the digital processing system 6, respectively by way of links 9, 10, 11, each of the links 9, 10 and 11 being capable of transmitting several signals separately.

The sequencer 8 includes an oscillator (not represented), for example, a quartz oscillator, phase-locked to the input signal and determining a stabilized clock which exhibits a frequency corresponding for example to a tenth of the frequency of said input signal.

Based on this stabilized clock, the sequencer 8 defines various clocks, represented in FIG. 2, and used as will be seen later to control the various elements of the device 1. Thus, represented in FIG. 2 are:

- a signal CK corresponding to the signal of the stabilized clock;
- a signal FMES corresponding to a recurrent time window for measuring the jitter;
- a signal DMES associated with the signal FMES; and
- a signal HCON corresponding to the clock signal of the analog digital converter 4.

The sequencer 8 transmits the signals FMES and DMES to the time amplitude converter 2 by way of the link 9.

The time amplitude converter 2 represented in FIGS. 3 includes:

- a flip-flop 13 with two inputs 14 and 15 and one output 16;
- an OR logic gate 17 connected by one 18 of its inputs to an output 16 of the flip-flop 13 and, at the outer input 19 to a link 9A corresponding to one of two branches

4

9A and 9B of the divided link 9, each of said branches 9A and 9B transmitting a particular signal as will be seen later;

- a transistor T1 of NPN type connected, by its base to an output 20 of the OR logic gate 17, by its emitter to a resistor R1 joined moreover to a fixed voltage VE, and by its collector to a point 22; and
- a capacitor C1 connected, on the one hand to the point 22 and, on the other hand, to earth, the voltage of the capacitor C1 being measurable by way of the link 5 connected to the point 22.

The flip-flop 13 receives on its input 15, to which the link 3A is connected, the digital signal to be analyzed and on its input 14, to which the link 9B is connected, the signal DMES which corresponds to the signal D of the flip-flop 13.

The first positive transition of the digital signal, when the signal DMES is high, provokes a change of state at the output 16 of the flip-flop 13 which switches from low to high. The signal at the output 16, combined by the OR logic gate 17 with the signal FMES corresponding to the measurement time window and transmitted by the link 9A, generates a pulse whose duration can vary as a function of the position of the transition with respect to said signals DMES and FMES. This pulse is integrated by way of the transistor T1 and the capacitor C1 so that at point 22 a signal 24 is obtained, represented in FIG. 4 in temporal correspondence with the signals DMES and FMES, and including measurement ramps 25 and a calibration ramp 26, both of which are shown in FIGS. 5 and 6, respectively.

The calibration ramp 26 is generated from a pulse 27 of the signal FMES of half-duration with respect to a pulse 29 corresponding to the actual time window such as defined in accordance with the invention.

The signal 24 is transmitted to the analog digital converter 4.

Upon the falling edge of the signal HCON, corresponding to the clock signal of the analog digital converter 4 and represented partially in FIGS. 5 and 6, the amplitudes of the ramps 25 and 26 are converted into digital values E1, E2, E3 and E4 by the analog digital converter 4.

The digital values E1, E2, and E3 of the measurement ramps 25 are transmitted to the digital processing system 6 which, determines the jitter of the digital signal from these digital values, as will be seen later.

The device 1 according to the invention furthermore includes a servocontrol device 28 intended for setting the amplitudes of the ramps in such a way:

That the value E4 of the calibration ramp 26 lies between two determined values L1 and L2, themselves lying between values A and B corresponding respectively to the lower and upper extreme input thresholds for the analog digital converter 4; and that the minimum value E3 (lying between A and B) of the various measurement ramps fluctuates about a determined value L3.

As shown in FIG. 1, the servocontrol device 28 includes;

- a comparison system 30, connected by way of a link 31 to the output of the analog digital converter 4, comparing on the one hand E4 and L1 and L2 and, on the other hand, E3 with L3, and determining as a function of this comparison two servocontrol signals AS1 and AS2 both capable of taking one of two values 0 or 1; and
- a charging-current system 32 connected to the point 22 of the time amplitude converter 2 by way of a link 33 and intended to modify the charging current of the capacitor C1 and a function of the value of the servocontrol signals AS1 and AS2 which are transmitted to it by way of links 34 and 35 respectively.

As shown in FIG. 7, to modify the charging current, the charging current system 32 includes two resistors R2 and R3 mounted in parallel and connected respectively to the links 34 and 35 and having a common point 37, to which are connected a capacitor C2 attached between ground and a resistor R4.

The resistor R4 is connected, on the one hand, to a resistor R5 attached for a fixed voltage VC and, on the other hand, to the emitter of a transistor T2 of PNP type, whose collector is connected to a resistor R6 attached to a fixed voltage VE, and whose base is connected to the base of a transistor T3, also of PNP type.

The emitter of the transistor T3 is connected to a resistor R7 attached to the voltage VC and the collector of the transistor T3 is connected to the link 33.

The response of the charging-current system 32 transmitted by the link 33 is adapted to the signals AS1 and AS2 input via the links 34 and 35 and it correspondingly modifies the charging current for the capacitor C1, to obtain the results mentioned above.

The digital values E1, E2, E3 of the measurement ramps 25 are utilized by the digital processing system 6 represented in FIG. 8 and including:

- a filtering system 40, connected to the analog digital converter 4 by the link 7, filtering the digital values and retaining only certain of said values for the calculation, as will be seen more specifically later;
- a calculator 41 which is connected by a link 42 to the filtering system 40, the calculator 41 performing the following operations:
  - defining the first value obtained over a series of measurements, for example, a video line, as a reference value Er and recording this value in an associated memory, not represented;
  - for each succeeding digital value E, composing the digital value E with the current reference value Er; and
- a comparator 43 connected by a link 44 to said calculator 41, comparing all the differences |E−Er| by absolute value, transmitted by the calculator 41, with a difference |E−Er| max recorded in a memory 45 which transmits this value to it via a link 46.

The comparator 43 transmits the largest difference, by way of a link 47 to the memory 45 which records this value in place of the value already recorded if it differs from the latter, or which, in the contrary case, preserves in memory the value already recorded.

The maximum thus obtained over a line corresponds to the peak-to-peak value of the jitter of the digital signal analyzed.

The memory 45 can forward this value by way of a link 48, corresponding to the output of the device 1 according to the invention.

It will be noted that comparison between the digital values E and the reference value Er can be performed, either directly by the calculator 41, or by a means of comparison associated with the calculator 41, the means of comparison possibly being a comparator already existing in the device 1, as for example the comparator 43 or a comparator of the filtering system 40 described below, or possibly being a special comparator, not represented, arranged specifically for this purpose.

Other systems may be attached to the link 48 and be directly integrated with the device 1 according to the invention, as for example a system for calculating at constant time intervals the mean of the values determined at the end of several successive lines.

The filtering system 40 is intended for retaining only the values of interest in calculating the jitter and represented in FIG. 9 includes:

- a memory 50 recording the smallest digital value obtained over a series of previous measurements, for example over the previous video line, the memory 50 being connected to one 7A of two branches 7A and 7B of the link 7;
- a means of calculation 51 connected by a link 52 to the memory 50 effecting the sum of this smallest digital value and the value L3; and
- means of comparison 53 connected by a link 54 to the means of calculation 51, comparing all the digital values transmitted by the link 7B with the sum and forwarding to the calculator 41 for their analysis only the values which are less than said sum.

It will be noted that various elements of said digital processing system 6 are controlled by the sequencer 8 by way of the link 11 which, for this purpose, is divided, correspondingly, into several branches, not represented, respectively attached to the elements to be controlled.

I claim:

1. A process for determining the jitter of a digital signal, comprising the steps of:

determining a recurrent time window (FMES);

generating a measurement ramp (25); with each recurrence of said time window (FMES), an amplitude of which grows proportionally with the duration between a start of said recurrence and a first positive transition of said digital signal within said recurrence;

obtaining said amplitude of said measurement ramps (25) at an end of said recurrences of the time window, converting said amplitude into digital values (EL, E2, E3);

determining the jitter of said signal from said digital values thus obtained defining a first digital value obtained as a reference value;

comparing each succeeding digital value with a current reference value when said digital value is less than said current reference value, said digital value being defined as new reference value; when said digital value is equal to said current reference value, the current reference value is subtracted from said digital value, and when said digital value is greater than said current reference value, the current reference value is subtracted from said digital value; and inter-comparing the differences this calculated with the largest difference, in terms of absolute value, being defined as a peak-to-peak value of the jitter of the signal.

2. A device (1) for determining the jitter of a digital signal comprising:

sequencer means (8) for determining in response to the digital signal to be analyzed, a recurrent time window (FMES) and various clocks (CD, DMES, HCON) intended to control the operation of said device (1);

time amplitude converter means (2) connected to said sequencer (8) for receiving the digital signal to be analyzed and generating measurement ramps (25) as a function to the position of positive transitions of said digital signal with respect to said recurrent time window (FMES);

analog-digital converter means (4) connected to said time amplitude converter means (2) for converting amplitudes of said measurement ramps (25) into digital values (E1, E2, E3); and digital processing means (6) connected to said analog digital converter (4) for determining the jitter of the signal from said digital values.

3. The device as defined in claim 2, wherein said time amplitude converter means (2) includes an integrator furnished with at least one capacitor (C1) which is to be charged.

4. A device (1) for determining the jitter of a digital signal comprising:

sequencer means (8) for determining in response to the digital signal to be analyzed, a recurrent time window (FMES) and various clocks (CD, DMES, HCON) intended to control the operation of said device (1);

time amplitude converter means (2) connected to said sequencer (8) for receiving the digital signal to be analyzed and generating measurement ramps (25) as a function of the position of positive transitions of said digital signal with respect to said recurrent time window (FMES);

analog-digital converter means (4) connected to said time amplitude converter means (2) for converting amplitudes of said measurement ramps (25) into digital values (E1, E2, E3);

digital processing means (6) connected to said analog digital converter (4) for determining the jitter of the signal from said digital values;

a servocontrol device (28) associated with said time amplitude converter means (2) which enables said amplitude of said measurement ramps (25) to be modified as a function of said digital values (E1, E2, E3) determined by the analog-digital converter means (4).

5. A device (1) for determining the jitter of a digital signal comprising:

sequencer means (8) for determining in response to the digital signal to be analyzed, a recurrent time window (FMES) and various clocks (CK, DMES, HCON) intended to control the operation of said device (1);

time amplitude converter means (2) connected to said sequencer (8) for receiving the digital signal to be analyzed and generating measurement ramps (25) as a function of the position of positive transition of said digital signal with respect to said recurrent time window (FMES);

analog digital converter means (4) connected to said time amplitude converter means (2) for converting amplitudes of said measurement ramps (25) into digital values (E1, E2, E3);

digital processing means (6) connected to said analog digital converter (4) for determining the jitter of the signal from said digital values;

said time amplitude converter means (2) including an integrator furnished with at least one capacitor (C1) which is to be charged; and a servocontrol device (28) associated with said time amplitude converter means (2) which enables said amplitude of said measurement ramps (25) to be modified as a function of said digital values (E1, E2, E3) determined by the analog-digital converter means (4).

6. The device as defined in claim 4 wherein said servocontrol device (28) modifies a charging current of said capacitor (C1) of said time amplitude converter means (2).

7. The device as defined in claim 5 wherein said servocontrol device (28) modifies a charging current of said capacitor (C1) of said time amplitude converter means (2).

8. The device as defined in claim 4 wherein said servocontrol device (28) is controlled by servocontrol signals defined as a function of an amplitude (E4) of a calibration ramp (26) with respect to two determined amplitude values (L1, L2).

9. The device as defined in claim 5, wherein said servocontrol device (28) is controlled by servocontrol signals defined as a function of an amplitude (E4) of a calibration ramp (26) with respect to two determined amplitude values (L1, L2).

10. The device as defined in claim 6 wherein said servocontrol device (28) is controlled by servocontrol signals defined as a function of an amplitude (E4) of a calibration ramp (26) with respect to two determined amplitude values (L1, L2).

11. The device as claimed in claim 4 wherein said servocontrol device (28) is controlled by servocontrol signals defined as a function of said amplitude of said measurement ramps (25) with respect to at least one determined amplitude value (L3).

12. The device as defined in claim 5 wherein said servocontrol device (28) is controlled by servocontrol signals defined as a function of said amplitude of said measurement ramps (25) with respect to at least one determined amplitude value (L3).

13. A device (1) for determining the jitter of a digital signal comprising:

sequencer means (8) for determining in response to the digital signal to be analyzed, a recurrent time window (FMES) and various clocks (CK, DMES, HCON) intended to control the operation of said device (1);

time amplitude converter means (2) connected to said sequencer (8) for receiving the digital signal to be analyzed and generating measurement ramps (25) as a function of the position of positive transitions of said digital signal with respect to said recurrent time window (FMES);

analog-digital converter means (4) connected to said time amplitude converter means (92) for converting amplitudes of said measurement ramps (25) into digital values (E1, E2, E3);

digital processing means (6) connected to said analog digital converter (4) for determining the jitter of the signal from said digital values; and said digital processing means (6) comprises:

a calculator (41) for receiving said digital values to be analyzed, defining a reference value and calculating said difference between said digital values and said reference value;

a comparator (43) for inter-comparing the differences thus calculated; and a memory (45) for recording the largest difference by absolute value and forwarding this result.

14. The device as defined in claim 13 wherein said digital processing means (6) further comprises:

a filtering system (40) arranged upstream of said calculator (41) in the direction of transmission of said digital values, and including:

a memory (50) for recording the smallest digital value obtained over a series of previous measurement;

calculating means (51) for effecting the sum of this smallest digital value and of a predetermined value; and comparison means (53) for comparing all said digital values determined by said analog-digital converter means (4) with said sum and forwarding to said calculator (41) for their analysis only the values which are less than the sum.

* * * * *

UNITED STATES PATENT AND TRADEMARK OFFICE
CERTIFICATE OF CORRECTION

PATENT NO. : 5,761,241
DATED : June 2, 1998
INVENTOR(S) : Bruno Jean-Marie Martin It is certified that error appears in the above-indentified patent and that said Letters Patent is hereby corrected as shown below:

In column 6, line 33 after "obtained" insert --;--

In column 6, line 44, after "differences" delete "this" and substitute --thus--.

In column 6, line 57, after "function" delete "to" and substitute --of--.

Signed and Sealed this

Twenty-fourth Day of November, 1998

BRUCE LEHMAN

Attest:

Attesting Officer

Commissioner of Patents and Trademarks

UNITED STATES PATENT AND TRADEMARK OFFICE
CERTIFICATE OF CORRECTION

PATENT NO. : 5,761,241
DATED      : June 2, 1998
INVENTOR(S): Bruno Jean-Marie Martin It is certified that error appears in the above-identified patent and that said Letters Patent is hereby corrected as shown below:

In column 6, line 38, after "as" insert --a--

Signed and Sealed this

Second Day of February, 1999

Attest:

Attesting Officer

Acting Commissioner of Patents and Trademarks